(12) United States Patent
Freitag et al.

(10) Patent No.: US 7,697,246 B2
(45) Date of Patent: Apr. 13, 2010

(54) MAGNETORESISTIVE SENSOR HAVING BIASING AFM LAYER IN CONTACT WITH FREE LAYER AND A TRACK WIDTH DEFINED BY A LEAD CONTACT AREA

(75) Inventors: James Mac Freitag, Sunnyvale, CA (US); Kuok San Ho, Santa Clara, CA (US); Mustafa Michael Pinarbasi, Morgan Hill, CA (US); Ching Hwa Tsang, Sunnyvale, CA (US)

(73) Assignee: Hitachi Global Storage Technologies Netherlands B. V., Amsterdam (NL)

( * ) Notice: Subject to any disclaimer, the term of this patent is extended or adjusted under 35 U.S.C. 154(b) by 562 days.

(21) Appl. No.: 11/502,955

(22) Filed: Aug. 10, 2006

(65) Prior Publication Data

US 2008/0037183 A1 Feb. 14, 2008

(51) Int. Cl.
*G11B 5/39* (2006.01)
(52) U.S. Cl. ............... 360/324.12; 360/320; 360/324.2
(58) Field of Classification Search ... 360/324.1–324.2, 360/320; 428/810–816; 257/421–427; 365/145, 365/158, 171–173
See application file for complete search history.

(56) References Cited

U.S. PATENT DOCUMENTS

| | | | | |
|---|---|---|---|---|
| 6,473,279 B2 | 10/2002 | Smith et al. | ............ | 360/324.12 |
| 6,517,896 B1 | 2/2003 | Horng et al. | ................ | 427/123 |
| 6,657,825 B2 | 12/2003 | Ho et al. | ..................... | 360/321 |
| 6,721,145 B2 | 4/2004 | Beach | ................... | 360/324.11 |
| 6,764,778 B2 | 7/2004 | Saito et al. | .................. | 428/692 |
| 6,853,521 B2 | 2/2005 | Hasegawa et al. | ...... | 360/324.11 |
| 7,035,062 B1* | 4/2006 | Mao et al. | ................ | 360/324.2 |
| 2002/0191348 A1* | 12/2002 | Hasegawa et al. | ........... | 360/314 |
| 2003/0197988 A1* | 10/2003 | Hasegawa et al. | ...... | 360/324.12 |
| 2003/0214761 A1 | 11/2003 | Freitag et al. | ............... | 360/322 |
| 2004/0090716 A1 | 5/2004 | Jayasekara | ............... | 360/324.2 |
| 2004/0150921 A1* | 8/2004 | Kagami et al. | ........... | 360/324.1 |

\* cited by examiner

*Primary Examiner*—A. J. Heinz
(74) *Attorney, Agent, or Firm*—Zilka-Kotab, PC

(57) ABSTRACT

A current perpendicular to plane (CPP) magnetoresistive sensor having a current path defined by first and second overlying insulation layers between which an electrically conductive lead makes content with a surface of the sensor stack. The current path being narrower than the width of the sensor stack allows the outer edges of the sensor stack to be moved outside of the active area of the sensor. This results in a sensor that is unaffected by damage at outer edges of the sensor layers. The sensor stack includes a free layer that is biased by direct exchange coupling with a layer of antiferromagnetic material (AFM layer). The strength of the exchange field can be controlled by adding Cr to the AFM material to ensure that the exchange field is sufficiently weak to avoid pinning the free layer.

32 Claims, 4 Drawing Sheets

MAGNETORESISTIVE SENSOR HAVING BIASING AFM LAYER IN CONTACT WITH FREE LAYER AND A TRACK WIDTH DEFINED BY A LEAD CONTACT AREA

FIELD OF THE INVENTION

The present invention relates to magnetoresistive sensors and more particularly to a current perpendicular to plane (CPP) magnetoresistive sensor having a track width defined by a lead contact area.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In current read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos $\theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The ever increasing demand for increased data rate and data capacity has lead a relentless push to develop magnetoresistive sensors having improved signal amplitude and reduced track width. Sensors that show promise in achieving higher signal amplitude include current perpendicular to plane (CPP) sensors. Such sensors conduct sense current from top to bottom, perpendicular to the planes of the sensor layers. Examples of CPP sensors include CPP GMR sensors and tunnel valve sensors. A CPP GMR sensor operates based on the spin dependent scattering of electrons through the sensor, similar to a more traditional CIP GMR sensor except that, as mentioned above, the sense current flows perpendicular to the plane of the layers. A tunnel valve operates based on the spin dependent tunneling of electrons through a non-magnetic, electrically insulating barrier layer.

Traditionally, the magnetization of the free layer has been accomplished by hard magnetic bias layers formed at either side of the sensor stack. However, the push for ever increased areal density has lead a continual push for sensors of ever decreasing size. As the size of the sensor shrinks, the free layer becomes less stable. The need for increased free layer stability is even more pronounced at higher signal amplitudes.

Another problem that arises as a result of the push for smaller sensors, is that as track width decreases, the magnetic performance of the sensor layers suffers. Manufacturing processes used to define the sensor (such as ion milling) cause a certain amount of damage to the sensor layers at the outside edges of the sensor. Areas nearer to the center are, however, unaffected by the manufacturing processes that damage the outside of the sensor. When sensors have a large track width, the damaged portion of the sensor layers at the outside of the sensor stack are a sufficiently small percentage of the sensor as a whole that the overall performance is not significantly affected. However, as sensor track width decreases, the damaged portion of the sensor makes up an unacceptably large percentage of the sensor, and performance suffers.

Therefore, there is a need for a sensor design that can provide increased free layer stability in CPP magnetoresistive sensor. There is also a need for a sensor design that can overcome the challenges presented by decreased track widths. Such a sensor would preferably overcome the performance problems caused by sensor damage at outside edges of the sensor stack.

SUMMARY OF THE INVENTION

The present invention provides a current perpendicular to plane (CPP) magnetoresistive sensor having a current path defined by first and second overlying insulation layers between which an electrically conductive lead makes contact with a surface of the sensor stack. The sensor stack includes a free layer that is biased by direct exchange coupling with a layer of antiferromagnetic material (AFM layer).

The strength of the exchange field can be controlled by adding Cr to the AFM material to ensure that the exchange field is sufficiently weak to avoid strongly pinning the free layer. Furthermore, the amount of Cr can be adjusted to provide a desired exchange field for biasing the free layer without making the free layer too stiff.

As discussed above in the Background of the Invention, the outer edges of a sensor are often damaged by processes such as ion milling used to define the sensor stack. However, according to the present invention, the sensor has a lead that contacts the sensor stack in central area removed from the outer edges of the sensor. This advantageously allows the sensor to have an active area that is remove from the outer edges of the sensor, resulting in a sensor that is unaffected by damage at outer edges of the sensor layers.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
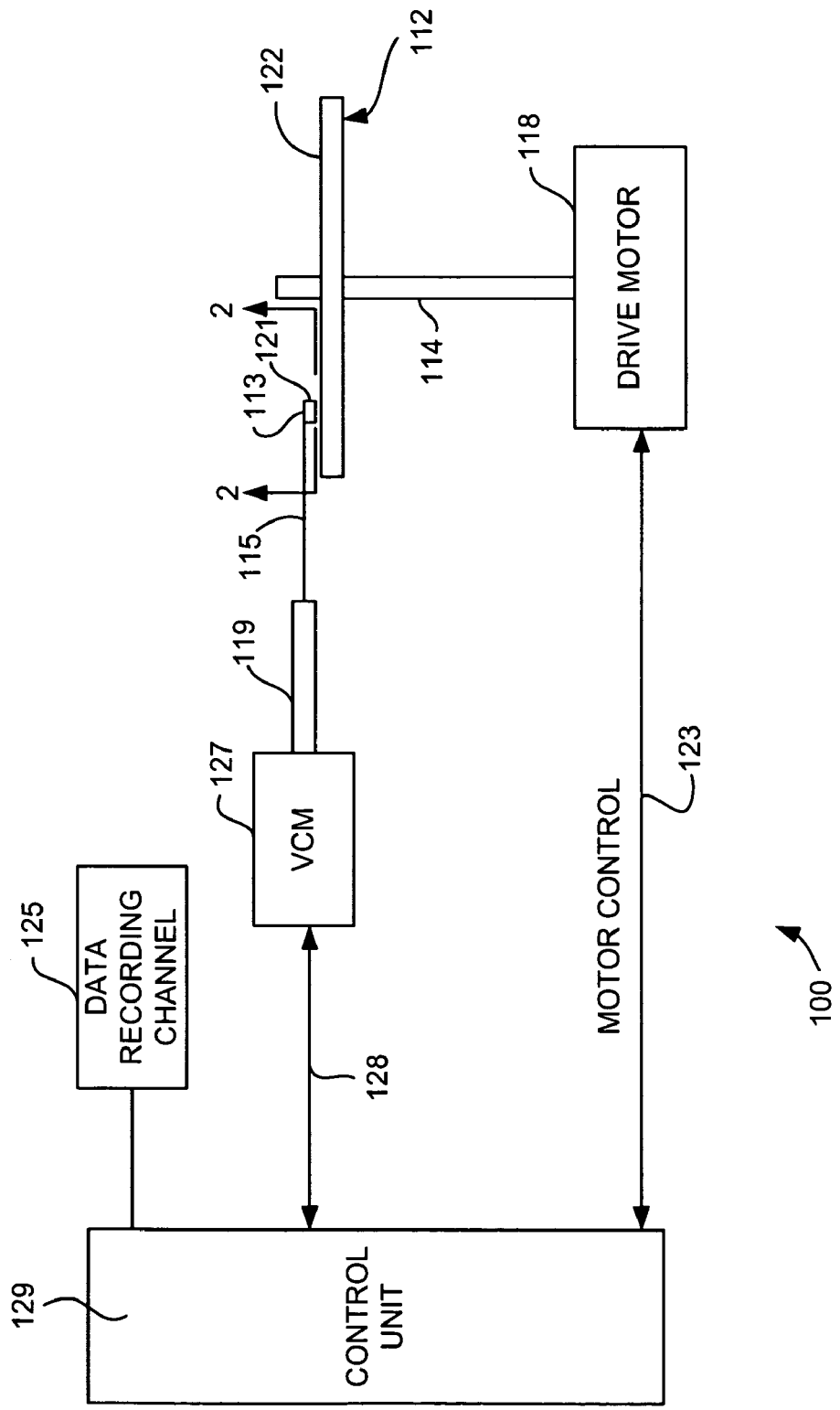
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
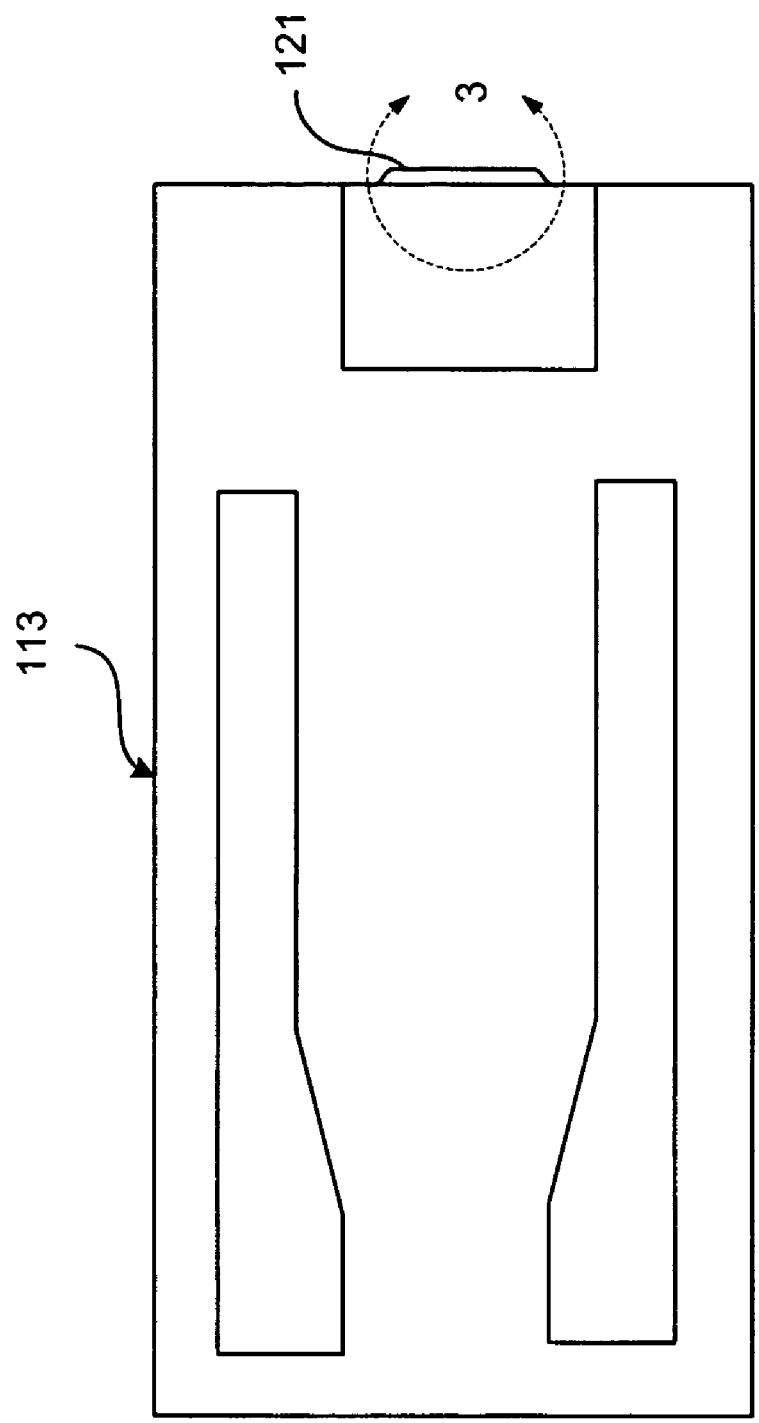
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
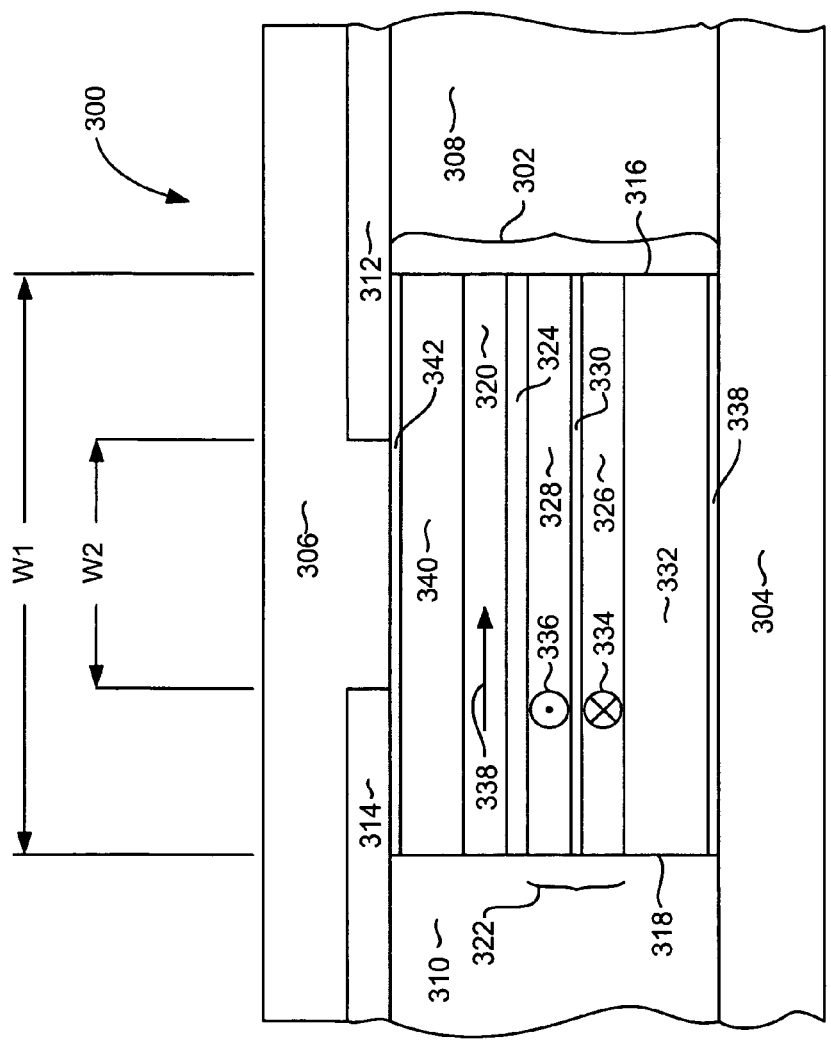
FIG. 3 is an enlarged ABS view taken from circle 3 of FIG. 2 rotated 90 degrees counterclockwise.

With reference now to FIG. 3, a CPP magnetoresistive sensor 300 according to an embodiment of the invention is described, the sensor being shown as viewed from the air bearing surface (ABS). The invention will be described in terms of a tunnel valve, but it should be understood that the invention would also apply to a CPP GMR sensor as well.

The sensor 300 includes a sensor stack 302 which is sandwiched between first and second leads 304, 306. The leads 304, 306 are constructed of an electrically conductive material and may be constructed of a material that is magnetic as well (such as NiFe) so that the leads 304, 306 can function as magnetic shields as well as leads.

First and second side insulation layers 308, 310 are provided at either lateral side of the sensor 302, filling most of the space between the leads 304, 306. The side insulation layers 304, 306 may be constructed of, for example, alumina ($Al_2O_3$). First and second overlay insulation layers 312, 314 are also provided. The overlay insulation layers 312, 314 extend over outer portions of the sensor stack 302, and may extend over the side insulation layers 308, 310 as well. The overlay insulation layers 312, 314 terminate at inner ends, which are separated by a width W2. As can be seen, the second lead 306 contacts the top of the sensor stack 302 in a location between the first and second overlay insulation layers 312, 314, having a contact width W2. The sensor stack 302 has a physical width W1 that is significantly larger than the width W2 between the inner ends of the overlay insulation layers 312, 314.

Because the current flowing from the second lead 306 is limited to an area having a width W2 between the overlay insulation layers 312, 314, the effective sensor track width is smaller than the actual width W1 of the sensor. However, due to the spreading of current as it passes through the sensor stack 302, the effective track width will be larger than the width W2 between the overlay insulation layers 312, 314. Therefore, the effective track width of the sensor 300 will be somewhere between W2 and W1.

As can be seen, the effective track width will be removed inward from the outer edges 316, 318 of the sensor stack 302. As mentioned above, the outer edges 316, 318 of the layers of the sensor stack can become damaged during manufacture so that the magnetic qualities of the sensor layers at the outer edges is much poorer than at the inner portions of the sensor stack 302. Because the effective track width of the sensor 300 is removed significantly inward from the outer edges 316, 318 of the sensor stack 302, the sensor 300 can enjoy a narrow track width while also being unaffected by any damage to the outer edges of the sensor stack 302.

With continued reference to FIG. 3, the sensor stack includes a free layer 320, a pinned layer structure 322 and a thin, non-magnetic, electrically insulating barrier layer 324 such as alumina sandwiched between the free and pinned layers 320, 322. If the sensor 300 is embodied in a CPP GMR sensor, the layer 324 would be a non-magnetic, electrically conductive spacer layer, such as Cu.

The pinned layer structure 322, can be of various configurations, and is preferably an antiparallel coupled (AP coupled), AFM pinned structure, that includes first and second magnetic layers AP1 326, AP2 328 which are antiparallel coupled across an AP coupling layer 330 such as Ru. The AP1 and AP2 layers 326, 328 can be, for example CoFe or some other magnetic material. The AP1 layer 326 is exchange coupled with a layer of antiferromagnetic material (first AFM layer) 332 such as PtMn, IrMn, etc. The exchange coupling with the AFM layer strongly pins the magnetization 334 of the AP1 layer 326 in a desired direction perpendicular to the ABS. Antiparallel coupling between the AP1 layer and the AP2 layer pins the magnetization 336 of the AP2 layer 328 in a direction perpendicular to the ABS and antiparallel with the magnetization 334 of the AP1 layer 326. A seed layer 338 may be provided at the bottom of the sensor stack to initiate a desired crystalline growth in the layers deposited there over.

With reference still to FIG. 3, the free layer 320 has a magnetization 338 that is biased in a desired direction parallel with the ABS. This biasing is provided by a second AFM layer 340 that is deposited directly on top of and in contact with the free layer 320. The second AFM layer 340 is configured to have a weaker exchange field than that of the first AFM layer 332 so that the second AFM layer 340 does not pin the magnetization 338 of the free layer 320 or make it too stiff. Accordingly, the second AFM layer 340 should have an exchange field of 50 to 300 Oe or more preferably 50 to 100 Oe. The exchange field strength can be adjusted, for example by adding Cr to the AFM layer 340. For example, the AFM layer 340 could be constructed of PtMnCr or IrMnCr, and increasing the Cr content will decrease the exchange field. A capping layer 342, such as Ta can be formed over the top of the sensor stack 302 to protect the sensor layers during manufacture.

Figure 4:
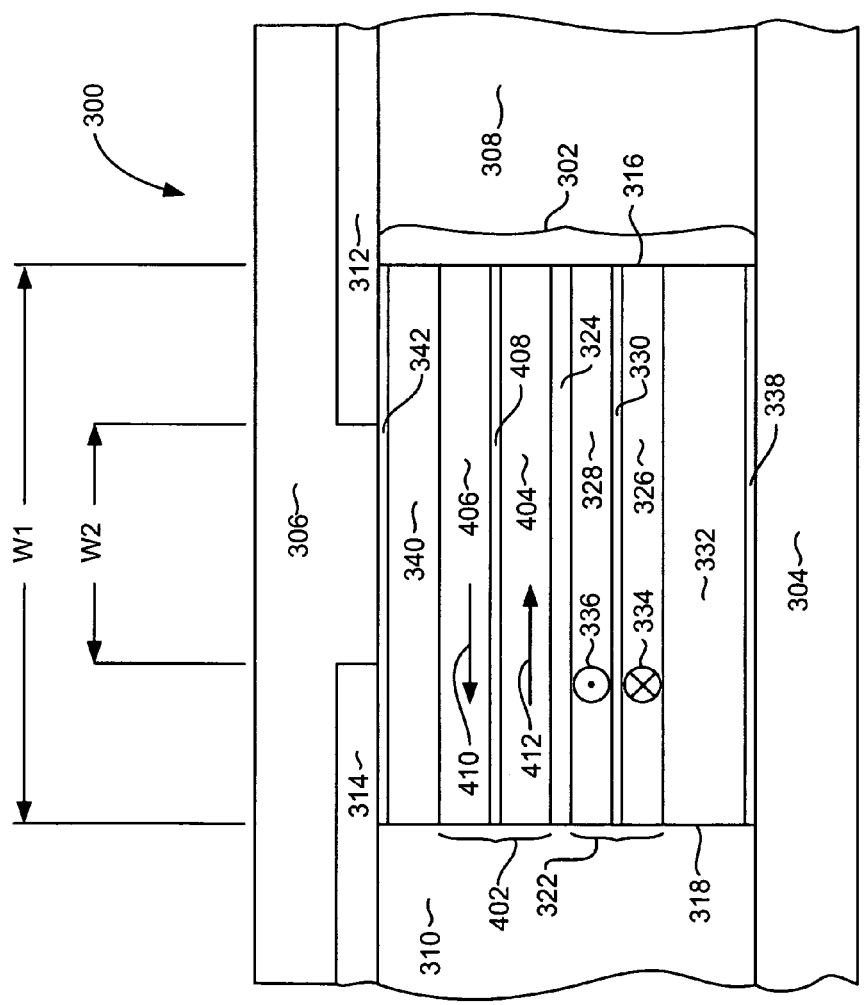
FIG. 4 is a view similar to that of FIG. 3 of showing an alternate embodiment of the invention.

Because the sensor 300 is a CPP structure, sense current will not be shunted through the second AFM layer 340 as would be the case in a CIP structure. With reference to FIG. 4, in the event that even greater free layer stability is needed, a free layer 402 having an AP coupled structure can be provided. In such a design, the free layer 402 can be constructed with first and second magnetic layers F1 and F2 404, 406 which are antiparallel coupled across a coupling layer 408, which can be, for example Ru. The second AFM layer 340 biases the magnetization 410 of the F2 layer 406 in a desired direction parallel with the ABS, and the antiparallel coupling biases the magnetization 412 of the F1 layer 404 in an opposite direction. Again, since the sensor 300 is a CPP sensor, current shunting will not be a problem as a result of the thicker free layer structure 402.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A current perpendicular to plane (CPP) magnetoresistive sensor, comprising:
   a sensor stack including a magnetic free layer structure, a magnetic pinned layer structure; a non-magnetic, electrically insulating barrier layer sandwiched between the free layer structure and the pinned layer structure, and a layer of antiferromagnetic material exchange coupled with and contacting the free layer, the sensor stack having a surface, and having laterally extending first and second outer portions and a center portion there between, wherein the layer of antiferromagnetic material exhibits antiferromagnetic properties in the center portion as well as in the first and second outer portions;
   a first overlay insulation layer extending over the surface of the sensor stack in the first outer portion of the sensor stack;
   a second overlay insulation layer extending over the surface of the sensor stack in the second outer portion of the sensor stack;
   an electrically conductive lead contacting the surface of the sensor stack in the center portion.

2. A sensor as in claim 1, wherein the layer of antiferromagnetic material comprises PtMnCr.

3. A sensor as in claim 1 wherein the layer of antiferromagnetic material comprises IrMnCr.

4. A sensor as in claim 1 wherein the layer of antiferromagnetic material comprises PtMnCr having a Cr content chosen to achieve an exchange field of 50-300 Oe with the free layer.

5. A sensor as in claim 1 wherein the layer of antiferromagnetic material comprises IrMnCr having a Cr content chosen to achieve an exchange field of 50-300 Oe with the free layer.

6. A sensor as in claim 1 wherein the layer of antiferromagnetic material comprises PtMnCr having a Cr content chosen to achieve an exchange field of 50-100 Oe.

7. A sensor as in claim 1 wherein the layer of antiferromagnetic material comprises IrMnCr having a Cr content chosen to achieve an exchange field of 50-100 Oe.

8. A sensor as in claim 1 wherein the antiferromagnetic material has an exchange field of 50-100 Oe.

9. A sensor as in claim 1 wherein the antiferromagnetic material has an exchange field of 50-300 Oe.

10. A sensor as in claim 1 wherein the first and second overlay insulation layers comprise alumina.

11. A sensor as in claim 1 further comprising first and second insulation layers disposed at the first and second sides of the sensor stack and extending laterally outward there from.

12. A sensor as in claim 1 wherein the free layer structure includes a first magnetic layer, a second magnetic layer and a non-magnetic antiparallel coupling layer sandwiched between the first and second magnetic layers, the first and second magnetic layers of the free layer being antiparallel coupled across the antiparallel coupling layer.

13. A current perpendicular to plane magnetoresistive sensor, comprising:
 a sensor stack having first and second laterally opposed sides and first and second surfaces each extending from the first side to the second side, the first and second sides being separated by a distance W1, the sensor stack having a free layer structure and a layer of antiferromagnetic material (AFM layer) exchange coupled with and contacting the free layer structure, wherein the layer of anti ferromagnetic material exhibits antiferromagnetic properties across the entire distance W1;
 a first electrically conductive lead contacting the first surface of the sensor stack;
 a second electrically conductive lead contacting the second surface of the sensor stack in a centrally disposed area having a width W2, W2 being smaller than W1; and
 first and second electrically insulating layers contacting the second surface of the sensor stack in areas laterally outside of the centrally disposed area.

14. A sensor as in claim 13 wherein the free layer structure includes a first magnetic layer, a second magnetic layer and a non-magnetic antiparallel coupling layer sandwiched between the first and second magnetic layers, the first and second magnetic layers of the free layer being antiparallel coupled across the antiparallel coupling layer.

15. A sensor as in claim 13 wherein the AFM layer comprises PtMnCr.

16. A sensor as in claim 13 wherein the AFM layer comprises IrMnCr.

17. A sensor as in claim 13 wherein the AFM layer comprises PtMnCr having a Cr content chosen to achieve an exchange field of 50-300 Oe.

18. A sensor as in claim 13 wherein the AFM layer comprises IrMnCr having a Cr content chosen to achieve an exchange field of 50-300 Oe.

19. A sensor as in claim 13 wherein the AFM layer comprises PtMnCr having a cr content chosen to achieve an exchange field of 50-300 Oe.

20. A sensor as in claim 13 wherein the AFM layer comprises IrMnCr having a Cr content chosen to achieve an exchange field of 50-300 Oe.

21. A sensor as in claim 13, wherein the first and second insulation layers are separated from one another by the distance W2.

22. A giant magnetoresistive current perpendicular to plane magnetoresistive sensor (CPP GMR), comprising:
 a sensor stack including a magnetic free layer structure, a magnetic pinned layer structure; a non-magnetic, electrically conductive spacer layer sandwiched between the free layer structure and the pinned layer structure, and a layer of antiferromagnetic material exchange coupled with and contacting the freelayer, the sensor stack having a surface, and having laterally extending first and second outer portions and a center portion there between, and wherein the layer of antiferromagnetic material exhibits antiferromagnetic properties in the center portion as well as in the first and second outer portions;
 a first overlay insulation layer extending over the surface of the sensor stack in the first outer portion of the sensor stack;
 a second overlay insulation layer extending over the surface of the sensor stack in the second outer portion of the sensor stack;
 an electrically conductive lead contacting the surface of the sensor stack in the center portion.

23. A sensor as in claim 22 wherein the layer of antiferromagnetic material comprises IrMnCr.

24. A sensor as in claim 22 wherein the layer of antiferromagnetic material comprises PtMnCr having a Cr content chosen to achieve an exchange field of 50-300 Oe with the free layer.

25. A sensor as in claim 22 wherein the layer of antiferromagnetic material comprises IrMnCr having a Cr content chosen to achieve an exchange field of 50-300 Oe with the free layer.

26. A sensor as in claim 22 wherein the layer of antiferromagnetic material comprises PtMnCr having a Cr content chosen to achieve an exchange field of 50-100 Oe.

27. A sensor as in claim 22 wherein the layer of antiferromagnetic material comprises IrMnCr having a Cr content chosen to achieve an exchange field of 50-100 Oe.

28. A sensor as in claim 22 wherein the antiferromagnetic material has an exchange field of 50-300 Oe.

29. A sensor as in claim 22 wherein the antiferromagnetic material has an exchange field of 50-300 Oe.

30. A sensor as in claim 22 wherein the first and second overlay insulation layers comprise alumina.

31. A sensor as in claim 22, wherein the layer of antiferromagnetic material comprises PtMnCr.

32. A sensor as in claim 22 wherein the free layer structure includes a first magnetic layer, a second magnetic layer and a non-magnetic antiparallel coupling layer sandwiched between the first and second magnetic layers, the first and second magnetic layers of the free layer being antiparallel coupled across the antiparallel coupling layer.

* * * * *

UNITED STATES PATENT AND TRADEMARK OFFICE
CERTIFICATE OF CORRECTION

PATENT NO.         : 7,697,246 B2                                        Page 1 of 1
APPLICATION NO.    : 11/502955
DATED              : April 13, 2010
INVENTOR(S)        : Freitag et al.

It is certified that error appears in the above-identified patent and that said Letters Patent is hereby corrected as shown below:

In claim 6, column 6, line 62, replace "50-I00 Oe" with --50-100 Oe--.

In claim 19, column 7, line 53, replace "50-300 Oe" with --50-100 Oe--.

In claim 20, column 7, line 56, replace "50-300 Oe" with --50-100 Oe--.

Signed and Sealed this
Eighteenth Day of January, 2011

David J. Kappos
*Director of the United States Patent and Trademark Office*